United States Patent [19]
Pusateri et al.

[11] Patent Number: 6,008,995
[45] Date of Patent: Dec. 28, 1999

[54] CARD CAGE ACCOMMODATING PC CARDS OF DIFFERENT SIZE

[75] Inventors: Mark Pusateri, West Boylston; John P. Jones, Lexington; Mahesh N. Ganmukhi, Carlisle, all of Mass.

[73] Assignee: Ascend Communications, Inc., Westford, Mass.

[21] Appl. No.: 08/924,473

[22] Filed: Aug. 19, 1997

[51] Int. Cl.[6] .................................................. H05K 7/14
[52] U.S. Cl. ......................... 361/796; 361/752; 361/756; 361/802; 361/801; 439/377
[58] Field of Search .................................. 361/684–686, 361/728–732, 735, 740–742, 747, 748, 752, 756, 758, 759, 785, 788, 790, 796, 801, 802, 804, 825, 829; 439/377

[56] References Cited

U.S. PATENT DOCUMENTS

| | | | |
|---|---|---|---|
| 3,662,224 | 5/1972 | Rauch | 317/101 |
| 3,733,523 | 5/1973 | Reynolds et al. | 361/802 |
| 3,850,492 | 11/1974 | Moore | 339/18 R |
| 3,878,438 | 4/1975 | Weisman | 317/101 DH |
| 3,939,382 | 2/1976 | Lacan et al. | 317/101 DH |
| 4,201,303 | 5/1980 | Smith | 211/41 |
| 5,172,306 | 12/1992 | Cantrell | 361/415 |
| 5,211,459 | 5/1993 | Wu | 312/223.2 |
| 5,266,781 | 11/1993 | Warwick et al. | 235/375 |
| 5,271,152 | 12/1993 | Murphy | 29/830 |
| 5,451,037 | 9/1995 | Lundstrom | 270/1.1 |
| 5,544,006 | 8/1996 | Radloff et al. | 361/683 |
| 5,696,668 | 12/1997 | Zenitani et al. | 361/741 |

*Primary Examiner*—Leo P. Picard
*Assistant Examiner*—Jayprakash N. Gandhi
*Attorney, Agent, or Firm*—Weingarten, Schurgin, Gagnebin & Hayes LLP

[57] ABSTRACT

A card cage for mounting printed circuit cards of at least two sizes is disclosed. The card cage includes an insert removably mounted to a mounting bar position between first and second ends of the card cage. The insert extends along a portion of the width of the card cage. When the insert is mounted to the mounting bar, a printed circuit card of a first length may be disposed between the insert and one of the card cage ends. When the insert is removed, a printed circuit card of a second length greater than the first length may be mounted between the first and second ends of the card cage. Plural mounting bars may be located between the respective card cage ends to accommodate printed circuit cards of different lengths.

12 Claims, 6 Drawing Sheets

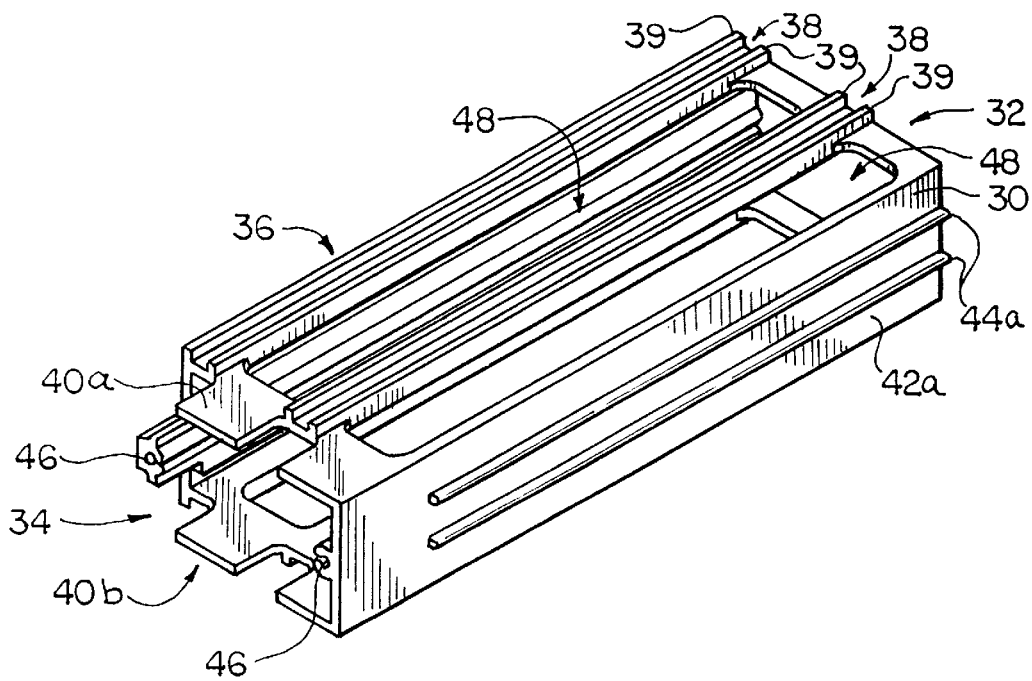
FIG. 2a
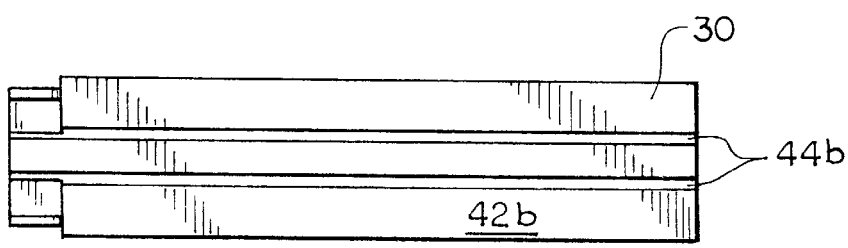
FIG. 2b
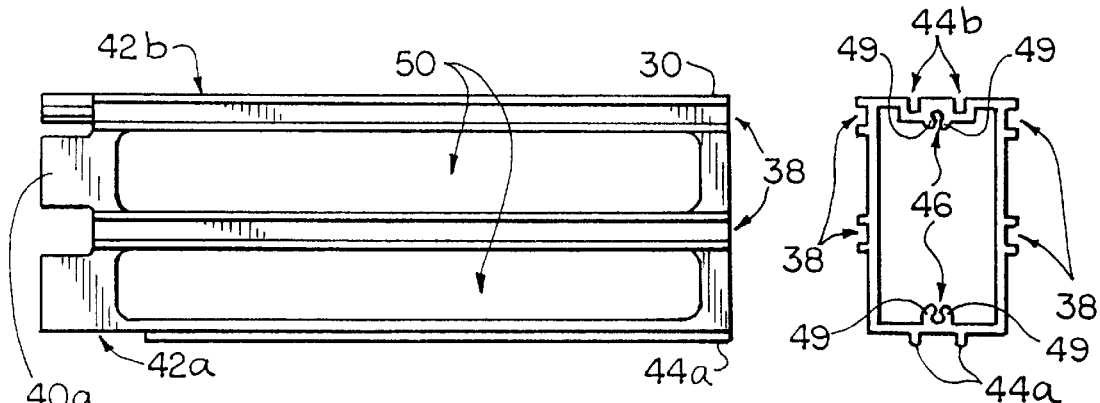
FIG. 2c
FIG. 2d

CARD CAGE ACCOMMODATING PC CARDS OF DIFFERENT SIZE

CROSS REFERENCE TO RELATED APPLICATIONS

Not Applicable

STATEMENT REGARDING FEDERALLY SPONSORED RESEARCH OR DEVELOPMENT

None

BACKGROUND OF THE INVENTION

The present invention relates to methods and apparatus for packaging electroni equipment and more particularly to a card cage which can accomodate printed circuit cards of different size.

Packaging requirements for electronic equipment often impose conflicting requirements on the chassis employed to house printed circuit (PC) cards. Electronic chassis are commonly provided which employ backplanes having electronic connectors. PC cards are typically mechanically retained and supported within the chassis and have connectors which interface with respective backplane connectors mounted on the backplane.

The overall dimensions of a chassis are usually selected to permit the utilization of the largest size board employed in the system. For example, to accommodate certain complex electronic functions on a single PC card, chassis are usually specified so as to accommodate a PC card having an area adequate to mount all necessary electronic and mechanical components needed to implement the respective electronic functions. While this sizing technique is perfectly adequate when all PC boards employed within a chassis are of the same type or when all PC boards within a chassis have a complexity which requires approximately the same board area to implement the relevant electronic functions, oftentimes, the board area requirements vary substantially between board types. The utilization of a common board size to accommodate all electronic functions within a specific card cage or chassis results in substantial waste of board space and reduced packing density since less complex functions must be implemented on the board having an area specified to accommodate the largest board area within the system. Alternatively, separate chassis have been provided to accommodate different board sizes. This technique adds undesirable mechanical complexity and cost to the system packaging.

For the above reasons, it would be desirable to have a card cage which was sufficiently flexible to permit the utilization of PC cards of different size within a single card cage.

SUMMARY OF THE INVENTION

In accordance with the present invention a card cage assembly is disclosed which accommodates PC cards of different size via use of at least one mid-cage insert. The card cage assembly in accordance with the present invention comprises first and second ends and first and second sides configured so as to form a generally rectangular receptable for PC cards. The card cage has a length defined generally by the distance between opposing ends and a width defined generally by the distance between opposing sides. A backplane having a plurality of connectors mounted thereon is mounted within the card cage. The card cage has a depth corresponding generally to the distance from the backplane to front edges of the card cage ends and sides.

PC card guides comprising conventional channels are provided in opposing relation on opposite interior surfaces of the card cage ends to guide and restrain one end of a PC card against sideways movement when the PC card is disposed within the chassis.

In the event that it is desired to utilize a PC card which extends the full length of the card cage, the full length PC card is inserted into the PC card guides located on opposing card cage ends. The full length PC card is slideably disposed in the card cage such that one or more connectors mounted on the PC card mate with cooperative connectors mounted on the backplane in a conventional manner.

One or more mid-cage inserts may be mounted at an intermediate position along the length of the card cage to permit PC cards shorter than the full length cards to be mounted within the card cage. The inserts have upper and lower surfaces which include ridges defining channels sized to receive the edge of a PC card. The inserts thus divide the cage so as to permit PC cards to be installed within the cage on either side of the insert with respective PC card edges slideably disposable between a channel or card guide on the insert and a corresponding opposing channel or card guide on the interior surface of the respective card cage end. Opposing sides of the inserts have a tongue and groove configuration to provide greater structural stability and rigidity when inserts are mounted side by side within the cage. A captive bolt disposed within the mid-cage insert is employed to mount the mid-cage insert to the backplane by threading the bolt into a metal structural mounting bar mounted to the backplane.

In the foregoing manner, PC cards of different sizes may be disposed within a card cage. For example, a PC card may comprise a full length card or a PC card having a length less than the full length card. Thus, the PC card size may be selected from among the available sizes to most optimally accommodate the space requirements based upon the area requirements for the relevant electronic and/or mechanical components.

BRIEF DESCRIPTION OF THE DRAWINGS

The present invention will be more fully understood by reference to the following Detailed Description of the invention taken in conjunction with the drawings, of which:

FIG. 2a is a perspective view of an extrusion employed in the mid-cage insert used in the card cage assembly of FIG. 1;

FIG. 2b is a side view of the extrusion of FIG. 2a;

FIG. 2c is a top view of the extrusion of FIG. 2a;

FIG. 2d is an end view of the extrusion of FIG. 2a;

FIG. 3 is a perspective view of a mid-cage insert illustrating a rear face place mounted to the extrusion of FIG. 2a;

FIG. 4 is a perspective of illustrating a front face plate mounted to the extrusion of FIG. 2a;

DETAILED DESCRIPTION OF THE INVENTION

Figure 1:
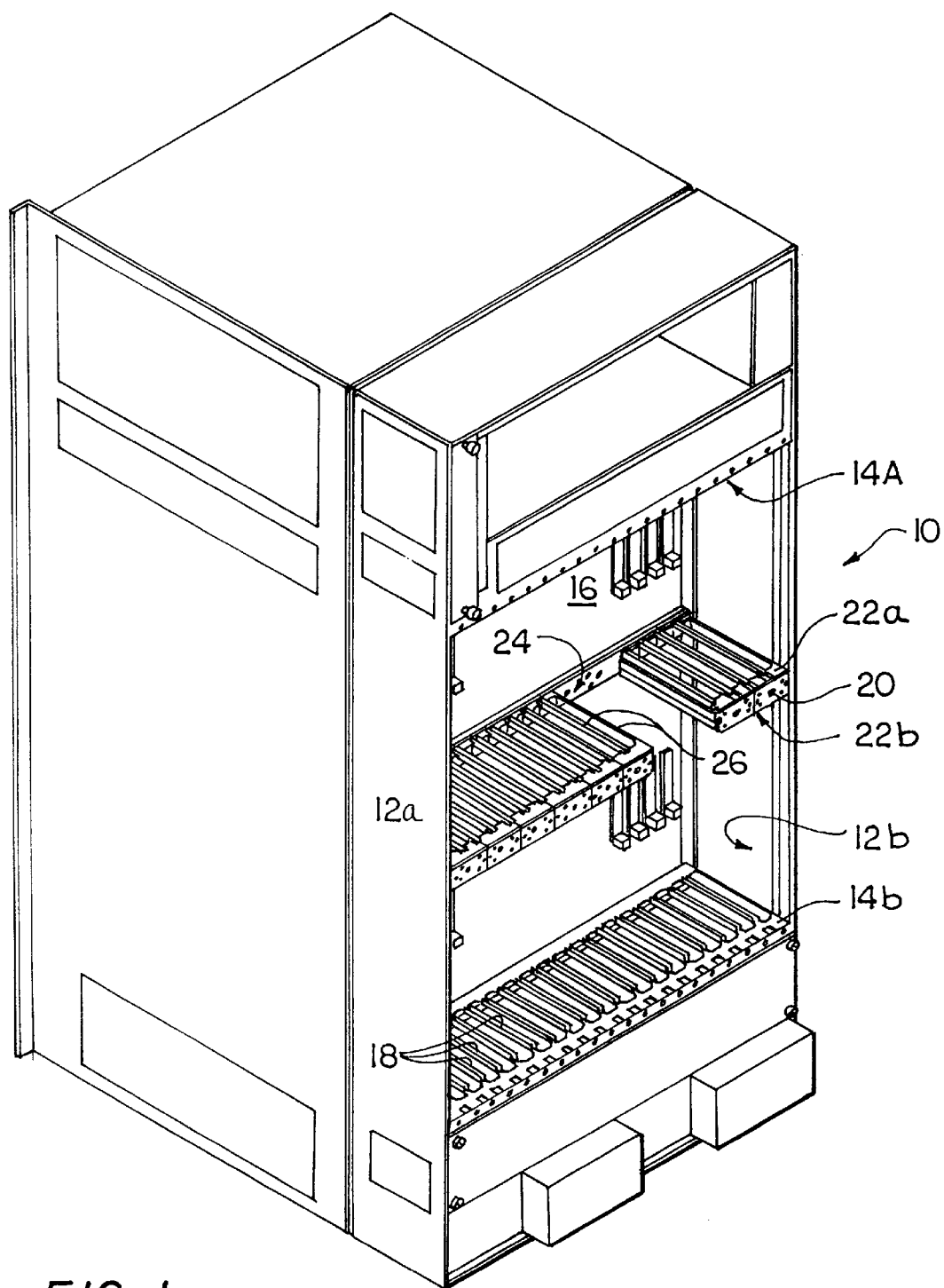
FIG. 1 is a perspective view of a mechanical assembly for a network switch including a card cage assembly in accordance with the present invention.

A card cage is illustrated in FIG. 1 which can accommodate PC boards of different length to permit improved packing densities to be achieved on PC boards disposed within the card cage. Referring to FIG. 1, the card cage 10 defines an opening to receive PC cards. The card cage 10 includes first and second sides 12a and 12b respectively, first and second ends 14a and 14b respectively and a backplane 16. The opening has a length 1 generally corresponding to the longest PC Card desired to be retained within the card cage. Card guides 18 are formed integrally with the ends 14a and 14b of the card cage as illustrated or comprise integrally molded plastic card guides as known in the art which are mounted to the respective ends 14a and 14b of the card cage 10. The card guides 18 mechanically support the PC cards and restrain sideways movement of the card when the PC card is slideably disposed between a pair of opposing card guides. Each card guide 18 is sized to receive an edge of one PC card. The card guides provided on respective first and second ends 14a and 14b of the card cage 10 are oriented in parallel opposed relation to permit a full length PC card of a length approximately equal to 1 to be supported between a corresponding pair of card guides 18 within the card cage 10.

Mid-cage inserts 20 may be mounted to a mounting bar 24 extending across as least a portion of the width of the card cage 10. The mounting bar may be mounted to the backplane 16 or alternatively, to the sides 12a and 12b of the card cage 10. The mid-cage inserts 20 have first and second surfaces 22a and 22b, respectively. Each of the first and second surfaces 22a and 22b is in opposed facing relation with the respective interior surface of the first and second ends 14a and 14b of the card cage 10 when the mid-cage inserts are mounted to the mounting bar 24 within the card cage. Mid-cage inserts 20 include card guides 26 which are either formed integrally with the mid-cage inserts or mounted to the inserts 20. The mid-cage insert card guides 26 are located in opposed parallel relation with the card guides 18 on respective first and second ends 14a and 14b of the card cage when the respective insert is mounted to the mounting bar 24 within the card cage 10.

In a preferred embodiment of the invention, the mid-cage insert is fabricated as an aluminum extrusion 30 as illustrated in FIG. 2a–2d. The extrusion 30 has a front end 32 and a rear end 34 and is preferably fabricated in long lengths which are then cut and subjected to secondary operations to produce the body portion 36 illustrated in FIGS. 2a–2d. In a preferred embodiment the body portion 36 includes channels 38 defined by protruding ridges 39 formed integrally with the extrusion 30. The ridges 39 are disposed on upper and lower sides 40a and 40b of the body portion 36 respectively. Pairs of ridges 39 serve as card guides when the inserts 20 are mounted within the card cage 10. The body portion 36 of the insert 20 also has a right side 42a which is provided with plural tongues 44a and a left side 42b which includes corresponding plural grooves 44b. The tongues 44a and grooves 44b are sized such that the tongues 44a mate with the grooves 44b of an adjacent mid-cage insert 20 in a tongue and groove arrangement when inserts 20 are mounted to the mounting bar 24 adjacent to one another within the card cage 10. The intermeshing of tongues 44a and grooves 44b on adjacent mid-cage inserts provides greater rigidity when the inserts 20 are mounted within the card cage 10 and serve to align adjacent inserts 20.

Generally circular openings 46 are defined by u shaped portions 48 of the extrusion 30. The openings 46 are sized to receive self threading bolts. A rear plate 60 is mounted to the rear end 34 of the body portion 36 and a front plate is mounted to the front end 32 of body portion 36 via bolts which extend through openings in the respective plates and are threaded into the surfaces defining the openings 46.

Additionally, elongated slots 50 are provided in the first and second sides 40a and 40b to facilitate air movement through the mid-cage inserts for purposes of cooling. The slots 50 may be formed by milling, stamping or any other suitable technique.

Figure 3:
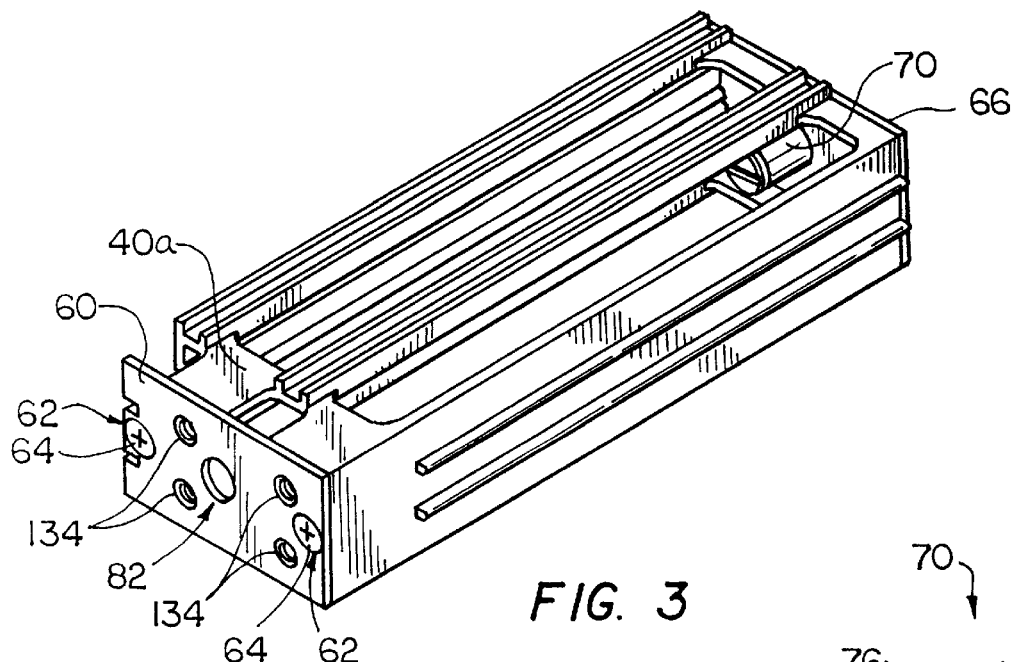
Figure 4:
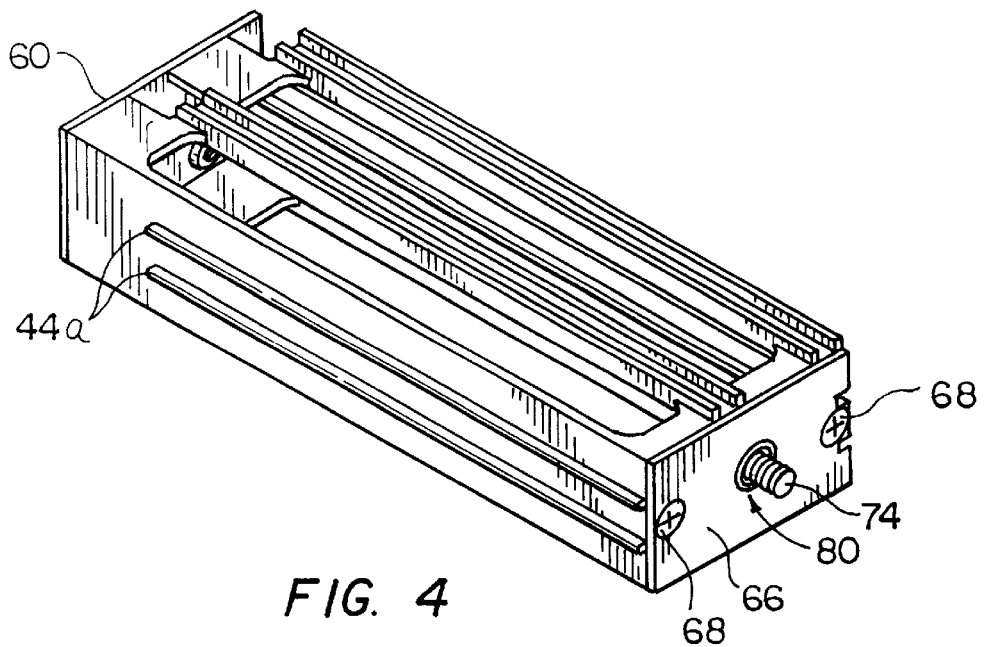

FIG. 3 illustrates the mounting of the rear plate 60 to the body portion 36 of the mid-cage insert 20. The rear plate 60 includes first and second mounting holes 62 spaced and positioned within the plate 60 so as to align with the openings 46 of the body portion 36 when the rear plate 60 is aligned in abutting relation with the rear end 34 of the body portion 36. The rear plate 60 is mounted to the rear end 34 of the body portion 36 via self threading bolts 64 or via the use of any other suitable fastener. A front plate 66 is mounted to the front end 32 of the body portion 36 as depicted in FIGS. 3 and 4. Bolts 68 pass through holes provided on opposite sides of the front plate and are threaded into surfaces defining the openings 46 within the body portion 36 of the insert 20 to mount the front plate to the front end of the body portion.

Figure 3A:
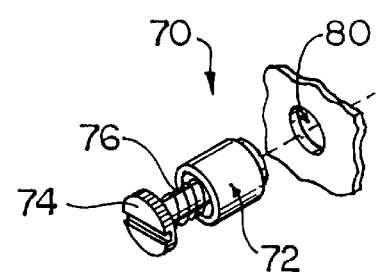
FIG. 3a is a perspective view illustrating the captive bolt assembly employed in the mid-cage insert of FIG. 3.

A captive bolt assembly 70, depicted in greater detail in FIG. 3a, is mounted to the front plate 66. The captive bolt assembly includes a bolt capture body 72, a threaded bolt 74 and a spring 76. The bolt capture body 72 of the captive bolt assembly 70 has a bolt entry end and a bolt exit end and is generally cylindrical in cross section. The spring 76 is coaxially disposed around the bolt 74. The bolt 74 is threaded through the body 72 so as to retain the spring 76 between the head of the bolt 74 and the body 72. Thus, the bolt 74 is urged toward the rear end 34 of the body portion 36 via the spring 76 in the absence of pressure applied by a screwdriver.

The bolt capture body 72 has a reduced outer diameter at the bolt exit end which is sized for an interference fit with an opening 80 generally centrally disposed within the front plate 66. The reduced diameter section of the bolt capture body is press fit within the opening 80 of the front plate 66 to mount the captive bolt assembly 70 to the front plate 66 of mid-cage insert 20.

The bolt 74 is employed to fasten the mid-cage insert 20 to the mounting bar 24 within the card cage 10. An access opening 82 is provided within the rear plate 60 to permit a screwdriver to be inserted there through to gain access to the bolt 74 for purposes of mounting the mid-cage insert 20 to the mounting bar 24 or removing the insert 20 from the card cage 10.

Additionally, as illustrated in FIG. 3, threaded openings 90 are provided in the rear plate 60. The threaded openings 90 are sized to receive cooperative captive mounting bolts 92 (See FIG. 5) as hereinafter discussed in greater detail.

The lower openings 90 are employed to securely mount a PC card disposed below the mid-cage insert 20 in the depicted orientation. Similarly, the upper threaded openings are employed to securely mount a PC card disposed above the mid-cage insert 20 in the depicted orientation.

Figure 5:
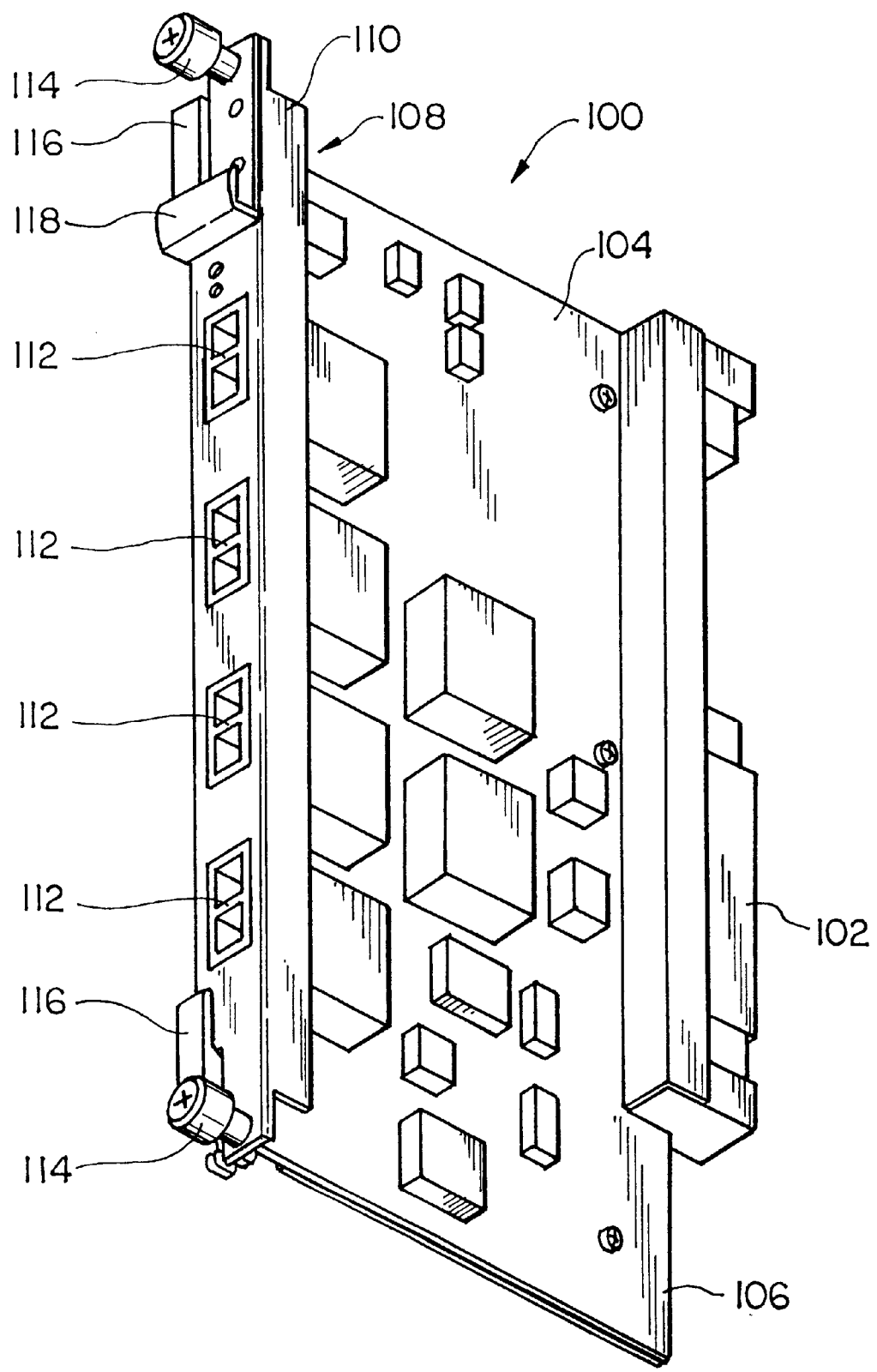
FIG. 5 is a perspective view illustrating a mounting plate mounted to a one-half height printed circuit card which is mountable in the card cage of FIG. 1 utilizing the mid-cage insert.

A half-height PC card assembly 100, which is mountable within the card cage 10, is illustrated in FIG. 5. The PC card assembly includes a PC card 104 having a plurality of electronic and mechanical components mounted thereon and has a first edge 106 and a second edge 108 on the opposite side of the PC card from the first edge. At least one connector 102 is disposed along the first edge 106 of the PC card 104 and a mounting plate 110 is mounted to the PC card 104 at the second edge 108 of the PC card 104. The mounting plate 110 has a number of openings for connectors 112. Mounting plate captive bolts 114 are provided at the upper and lower ends of the mounting plate 110. The captive bolts 114 are employed to securely mount the PC card assembly 100 within the card cage 10 as hereinafter discussed. The half-height PC card assembly is sized so as to be slideably disposable between a card guide 18 on one end 14a or 14b of the card cage 10 and a card guide 39 formed integral with or mounted to the mid-cage insert 20 when the insert 20 is installed within the card cage 10. Additionally, the PC card assembly 100 includes card ejectors mounted to the mounting plate 110 at the upper and lower ends of the mounting plate. The ejectors 116 cooperate with mid-cage inserts and respective ends of the card cage to facilitate insertion of the PC card assembly 100 into the card cage and removal of the assembly 100 therefrom. The PC card assembly 100 further includes a slidable latch 118 which is latched in a first position and unlatched in a second position. The latch prevents removal of the PC card assembly 100 from the card cage 10 when the latch is disposed in the first latched position.

Figure 6:
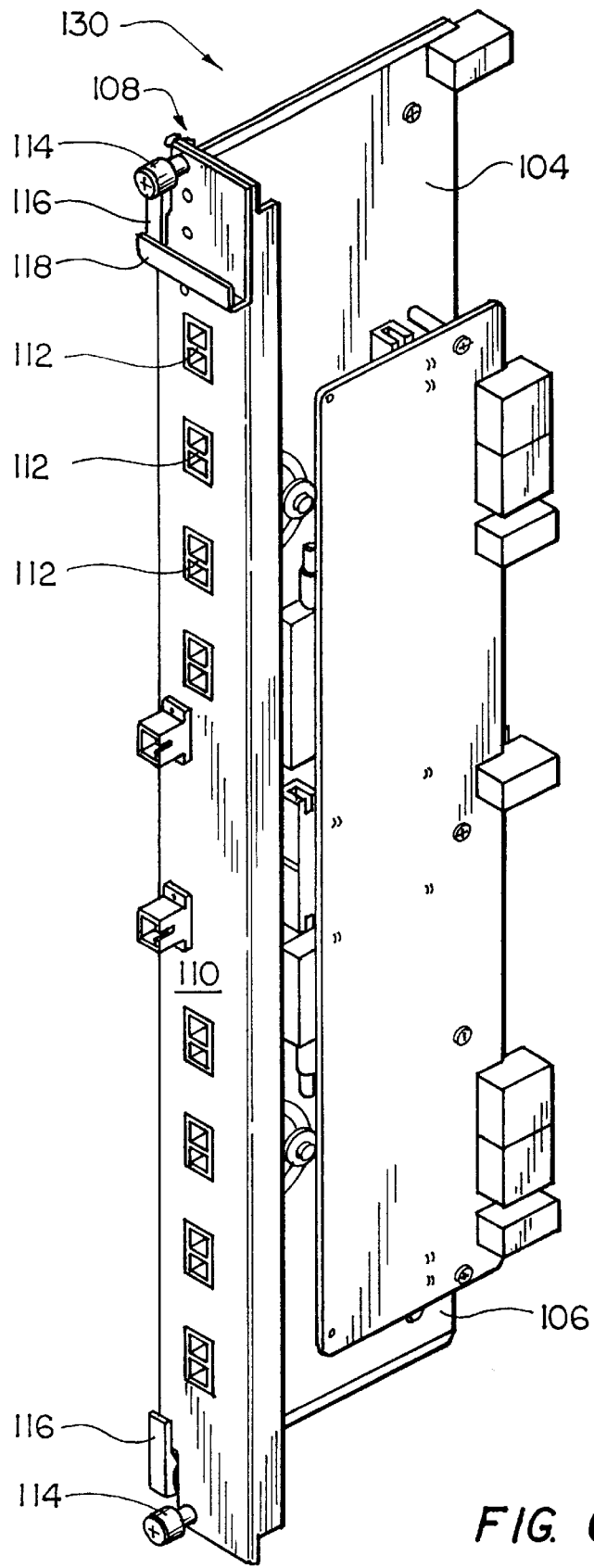
FIG. 6 is a perspective view illustrating a mounting plate mounted to a full height printed circuit card which is mountable in the card cage of FIG. 1 without use of the mid-cage insert.

FIG. 6 illustrates a full height PC card 130 which can be inserted within the card cage 10 provided the respective associated mid-cage insert 20 is not installed. The numerals in FIG. 6 correspond generally to the numerals in FIG. 5 for similar components. It is noted however that the full height PC card 130 has a height selected such that the upper and lower edges of the card are slideably disposable between the card guides 18 on the respective ends 14a and 14b of the card cage 10.

Figure 7:
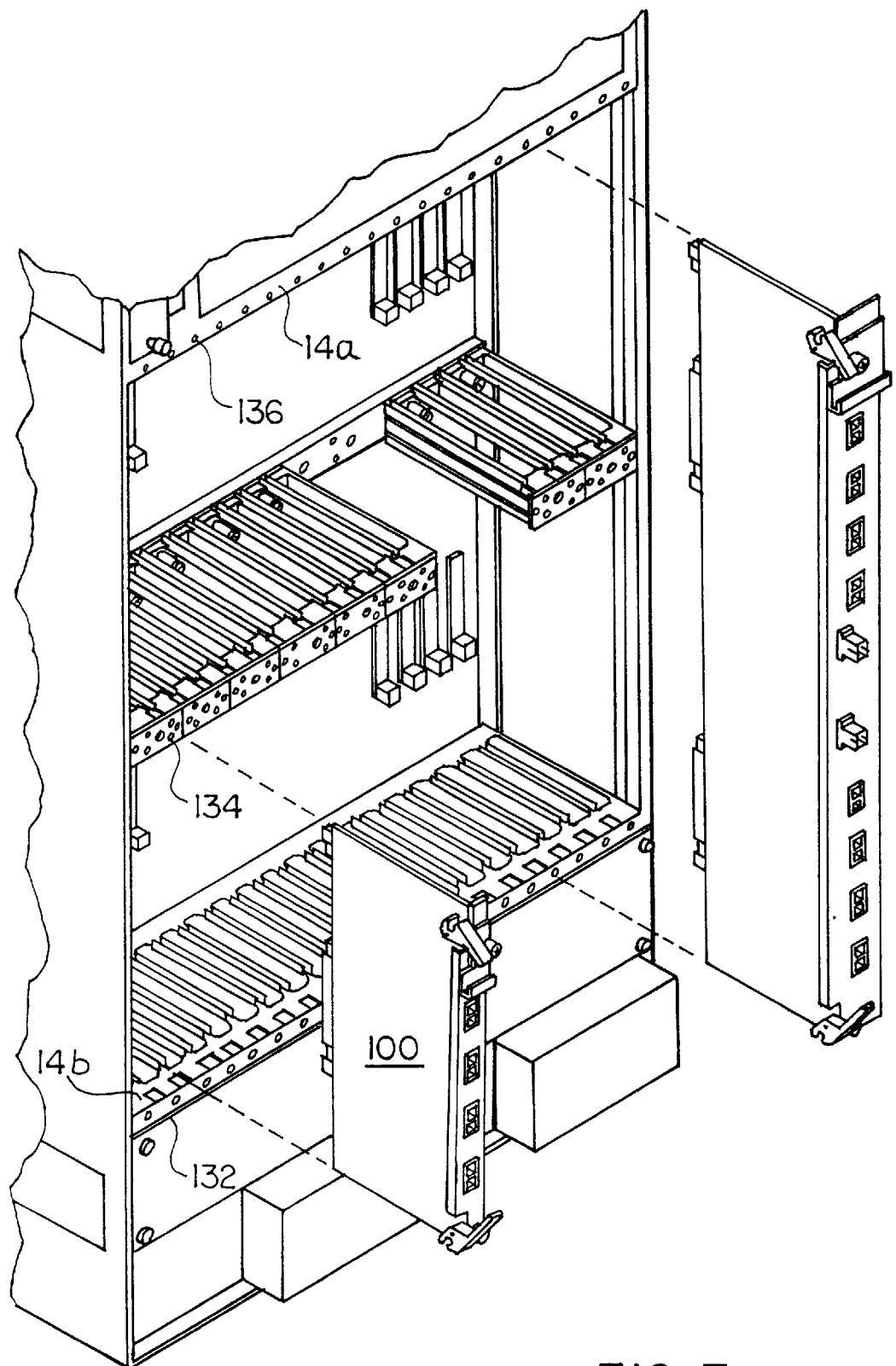
FIG. 7 is a perspective view illustrating the mounting of half height and full height pc cards within the card cage of FIG. 1.

FIG. 7 illustrates a half height PC card 100 and a full height PC card 130 being installed within the card cage 10. When the half height PC card 100 is fully seated within card guides between the lower end 14b and the associated mid-cage insert 20, the captive bolts 114 are tightened into a threaded opening 132 in the lower end 14b and a threaded opening 134 in the mid-cage insert 20 (See also FIG. 5). While the half height PC card 100 is illustrated as being installed below the mid-cage inserts 20 it should be appreciated that the half-height cards 100 may also be installed above the mid-cage inserts 20 in which case the lower captive bolt 114 engages the threaded opening 134 within the mid-cage insert 20 and the upper captive bolt engages the threaded opening 136 within the upper end 14a of the card cage 10.

While the mid-cage inserts 20 are depicted as being mounted half way between the upper end 14a and the lower end 14b of the card cage, it should further be appreciated that the mounting bar 24 and the mid-cage inserts 20 may be located at any position between the respective ends. In the event the mid-cage inserts 20 are not disposed half way between the respective ends, the sizes of the boards mounted above and below the inserts will differ. Such may be of benefit should it be desired to accommodate boards of three sizes within the card cage 10.

Additionally, more than a single mounting bar may be mounted within the card cage to accommodate three or more rows of PC cards of varying sizes and, as discussed above, the respective rows may accommodate PC cards of different size by appropriate specification of the position of the mounting bars 24 within the card cage 10.

While the card cage has been generally described as employing a backplane, it should be appreciated that such term is used herein generally to also include midplanes or motherboards.

It will be appreciated by those of ordinary skill in the art that modifications and variations of the presently disclosed card cage and method for mounting PC cards of varying size are possible without departing from the inventive concepts disclosed herein. Accordingly, the invention should not be viewed as limited to the disclosed exemplary embodiment, but rather, should be limited solely by the scope and spirit of the appended claims.

What is claimed is:

1. A card cage for receiving PC cards of at least a first length and a second length wherein said second length is greater than said first length, comprising:
    first and second card cage ends spaced apart in opposed relation, each of said card cage ends having an inner surface;
    a first plurality of card guides disposed on said inner surfaces of said first and second card cage ends in opposed parallel corresponding relation;
    at least one mounting bar mounted between said first and second card cage ends and substantially parallel to said ends;
    at least one insert, removably mounted to said at least one mounting bar, said at least one insert having first and second surfaces and having a second plurality of card guides disposed on at least one of said first and second surfaces, wherein at least one of said second plurality of card guides disposed on said at least one of said first and second surfaces is in a spaced parallel opposed relation with at least one of said first plurality of card guide disposed on one of said ends, said insert comprising a body portion, a front plate and a rear plate, said body portion having a front end and a rear end and wherein said front and rear plates are mounted to respective front and rear ends of said body portion; and
    at least one PC card of a first length being slideably disposable and capable of being retained between respective card guides of said insert, and at least one of said ends and at least one PC card of a second length being slideably disposable and capable of being retained between respective card guides of said first end and said second end.

2. The card cage of claim 1 wherein said body portion comprises an extrusion.

3. The card cage of claim 2 wherein said extrusion has front and rear ends and said insert further comprises a rear plate and a front plate mounted to respective front and rear ends of said extrusion.

4. The card cage of claim 2, wherein said extrusion has first and second opposite sides and said extrusion includes tongues projecting from one of said sides and includes grooves in the other of said sides and said tongues and grooves are sized and positioned such that said tongues of a insert extend into and mate with said grooves of a second inserts when said first and second inserts are mounted to said mounting bar side by side.

5. The card cage of claim 4 wherein said extrusion has third and fourth opposing sides and wherein said third and fourth sides include openings along said sides to permit the passage of air therethrough.

6. The card cage of claim 1 wherein said card guides disposed on said first and second card cage ends are integral with said ends.

7. The card cage of claim 1 wherein said card guides disposed on said insert are integral with said insert.

8. The card cage of claim 1 wherein said card guides disposed on said first and second card cage ends are mounted to said ends.

9. The card cage of claim 1 wherein said card guides disposed on said inserts are mounted to said inserts.

10. The insert of claim 1 wherein said body portion rear plate, said body portion front end and said body portion rear end include corresponding threaded openings sized to receive captive bolts for securing a PC card within said card cage.

11. The card cage of claim 10 further including a mounting plate mounted to said at least one PC card of a first length, at least one captive bolt extending through said mounting plate wherein said at least one captive bolt is positioned to threadably mate with one of said threaded openings in one of said ends and said rear plate.

12. The card cage of claim 1 wherein said mounting bar includes a plurality of threaded openings along the length of said bar, wherein said rear plate includes an opening and wherein said insert further includes a bolt extending through said opening within said rear plate and screwed into one of said plurality of threaded openings along said bar to secure said insert to said mounting bar.

* * * * *